US011616488B2

(12) United States Patent
Dasgupta et al.

(10) Patent No.: US 11,616,488 B2
(45) Date of Patent: Mar. 28, 2023

(54) FBAR DEVICES HAVING MULTIPLE EPITAXIAL LAYERS STACKED ON A SAME SUBSTRATE

(71) Applicant: INTEL CORPORATION, Santa Clara, CA (US)

(72) Inventors: Sansaptak Dasgupta, Hillsboro, OR (US); Paul B. Fischer, Portland, OR (US); Han Wui Then, Portland, OR (US); Marko Radosavljevic, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 1061 days.

(21) Appl. No.: 16/326,590

(22) PCT Filed: Sep. 30, 2016

(86) PCT No.: PCT/US2016/054696
§ 371 (c)(1),
(2) Date: Feb. 19, 2019

(87) PCT Pub. No.: WO2018/063297
PCT Pub. Date: Apr. 5, 2018

(65) Prior Publication Data
US 2019/0229705 A1   Jul. 25, 2019

(51) Int. Cl.
*H03H 9/205*   (2006.01)
*H03H 3/02*    (2006.01)
(Continued)

(52) U.S. Cl.
CPC .......... *H03H 9/205* (2013.01); *H01L 27/20* (2013.01); *H01L 41/081* (2013.01);
(Continued)

(58) Field of Classification Search
CPC ...... H03H 9/205; H03H 3/02; H03H 9/02031; H03H 9/173; H03H 9/581; H03H 9/587;
(Continued)

(56) References Cited

U.S. PATENT DOCUMENTS 5,057,802 A * 10/1991 Ozeki ............... H03H 9/1028
174/559
5,332,982 A * 7/1994 Kawakami ......... H03H 9/605
333/189

(Continued)

FOREIGN PATENT DOCUMENTS

JP   2008172711 A   7/2008
WO  2018063297 A1   4/2018

OTHER PUBLICATIONS

International Search Report and Written Opinion received for PCT/US2016/054696, dated Apr. 25, 2017. 11 pages.
(Continued)

*Primary Examiner* — Peter Dungba Vo
*Assistant Examiner* — Jose K Abraham
(74) *Attorney, Agent, or Firm* — Schwabe, Williamson & Wyatt, P.C.

(57) ABSTRACT

An integrated circuit film bulk acoustic resonator (FBAR) device having multiple resonator thicknesses is formed on a common substrate in a stacked configuration. In an embodiment, a seed layer is deposited on a substrate, and one or more multi-layer stacks are deposited on the seed layer, each multi-layer stack having a first metal layer deposited on a first sacrificial layer, and a second metal layer deposited on a second sacrificial layer. The second sacrificial layer can be removed and the resulting space is filled in with a piezoelectric material, and the first sacrificial layer can be removed to release the piezoelectric material from the substrate and suspend the piezoelectric material above the substrate. More than one multi-layer stack can be added,
(Continued)

each having a unique resonant frequency. Thus, multiple resonator thicknesses can be achieved on a common substrate, and hence, multiple resonant frequencies on that same substrate.

16 Claims, 9 Drawing Sheets

(51) Int. Cl.
  H03H 9/58 (2006.01)
  H03H 9/60 (2006.01)
  H03H 9/17 (2006.01)
  H01L 27/20 (2006.01)
  H01L 41/08 (2006.01)
  H01L 41/187 (2006.01)
  H01L 41/29 (2013.01)
  H01L 41/316 (2013.01)
  H03H 9/02 (2006.01)

(52) U.S. Cl.
  CPC ............ *H01L 41/187* (2013.01); *H01L 41/29* (2013.01); *H01L 41/316* (2013.01); *H03H 3/02* (2013.01); *H03H 9/02031* (2013.01); *H03H 9/173* (2013.01); *H03H 9/581* (2013.01); *H03H 9/587* (2013.01); *H03H 9/605* (2013.01); *H03H 2003/021* (2013.01); *Y10T 29/42* (2015.01)

(58) Field of Classification Search
  CPC .. H03H 9/605; H03H 2003/021; H01L 27/20; H01L 41/081; H01L 41/187; H01L 41/29; H01L 41/316; Y10T 29/42
  See application file for complete search history.

(56) References Cited

U.S. PATENT DOCUMENTS

| 9,154,112 B2* | 10/2015 | Burak | H03H 9/58 |
| 2005/0012570 A1* | 1/2005 | Korden | H03H 9/583 |
| | | | 333/191 |
| 2006/0158284 A1* | 7/2006 | Ruby | H03H 9/605 |
| | | | 29/25.35 |
| 2007/0086080 A1 | 4/2007 | Larson, III et al. | |
| 2007/0139139 A1 | 6/2007 | Park et al. | |
| 2007/0176710 A1* | 8/2007 | Jamneala | H03H 9/589 |
| | | | 333/191 |
| 2008/0169884 A1* | 7/2008 | Matsumoto | H03H 9/583 |
| | | | 333/187 |
| 2009/0096547 A1* | 4/2009 | Wang | H03H 9/583 |
| | | | 333/133 |
| 2009/0096550 A1* | 4/2009 | Handtmann | H03H 9/0095 |
| | | | 333/189 |
| 2009/0273415 A1* | 11/2009 | Frank | H03H 9/583 |
| | | | 333/187 |
| 2011/0304412 A1* | 12/2011 | Zhang | H03H 9/588 |
| | | | 29/25.35 |
| 2012/0086522 A1* | 4/2012 | Mao | H03H 3/04 |
| | | | 29/25.35 |
| 2012/0248941 A1* | 10/2012 | Shirakawa | H03H 9/585 |
| | | | 310/365 |
| 2012/0280767 A1* | 11/2012 | Burak | H03H 9/587 |
| | | | 333/191 |
| 2016/0065172 A1* | 3/2016 | Shealy | H03H 3/02 |
| | | | 310/348 |

OTHER PUBLICATIONS

International Preliminary Report on Patentability received for PCT/US2016/054696, dated Apr. 2, 2019. 7 pages.

* cited by examiner

FBAR DEVICES HAVING MULTIPLE EPITAXIAL LAYERS STACKED ON A SAME SUBSTRATE

CROSS-REFERENCE TO RELATED APPLICATIONS

This patent application is a U.S. National Phase Application under 35 U.S.C. § 371 of International Application No. PCT/US2016/054696, filed on Sep. 30, 2016, the entire contents of which is hereby incorporated by reference herein.

BACKGROUND

Radio frequency (RF) filters are an important component in modern communication systems. With the growing number of bands and modes of communications, the number of RF filters in a mobile device front end can multiply quickly. Resonators, such as film bulk acoustic resonators (FBAR), sometimes referred to as thin-FBAR (TFBAR), are some components that are used to make RF filters. An FBAR generally includes a piezoelectric material located between two electrodes and acoustically isolated from the surrounding medium. A typical front end must filter out multiple operating frequencies, which necessitates multiple distinct RF filters, generally one RF filter for each operating frequency to be filtered.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. In short, the figures are provided merely to show example structures.

DETAILED DESCRIPTION

Techniques are disclosed for forming integrated circuit resonator devices using piezoelectric films that form a structure capable of operating at multiple resonant frequencies on a single substrate. In some cases, the piezoelectric stack of the resonator device may include an epitaxial III-V layer such as an aluminum nitride (AlN) or other group III material-nitride (III-N) compound film (e.g., any combination of one or more of gallium, indium, and aluminum with nitrogen) deposited as a part of a III-V material stack, although any other suitable piezoelectric materials can be used. According to an embodiment, a seed layer of group III-V semiconductor material is deposited on a substrate. One or more multi-layer epitaxial stack(s) are deposited on the seed layer and are etched and filled to form a multi-frequency resonator device on a single substrate. In more detail, each multi-layer stack initially includes a first sacrificial layer, a first metal layer deposited thereon, a second sacrificial layer deposited on the first metal layer and a second metal layer deposited on the second sacrificial layer. The second sacrificial layer is then etched or otherwise removed and then filled in with a group III-V semiconductor material to form a resonator device with the first and second metal layers that has a specified thickness equal to the thickness of the second sacrificial layer, according to an embodiment. In still further embodiments, multiple such stacks can be deposited on top of each other, each etched and then filled in a simultaneous fashion to achieve multiple resonator devices on a common substrate. The group III-V semiconductor material can be, for example, AlN. Numerous variations and configurations will be apparent in light of this disclosure.

General Overview

RF filters continue to be a major factor in the costs of RF front end and the total integrated circuit (IC) area available, particularly in light of 5G mobile telecommunication technology on the horizon. Aluminum nitride (AlN) has been a common piezoelectric film material for FBARs in the RF filter space. However, due to processing constraints, polycrystalline AlN is typically deposited via a sputtering technique after back electrode processing. As will be appreciated in light of this disclosure, sputtered AlN alone is of significantly poorer quality compared to single crystal AlN that is deposited via epitaxial techniques, such as, for example, chemical vapor deposition (CVD), metal-organic chemical vapor deposition (MOCVD) and molecular-beam epitaxy (MBE). One potential drawback associated with purely sputtered piezoelectric material layers includes difficulty in controlling thickness of the sputtered piezoelectric layer(s).

Thus, and in accordance with one or more embodiments of the present disclosure, techniques are provided for forming integrated circuit FBAR devices using epitaxially grown piezoelectric elements that define the thickness of the epitaxial layer(s). The FBAR device can be provided in a stacked configuration, each FBAR in the stack having a different operating frequency, based on the thickness of the epitaxial layers associated with that particular FBAR. A number of forming techniques are provided. In some example embodiments, a seed layer is deposited on a substrate, and then a first multi-layer epitaxial stack is deposited on the seed layer, and a second multi-layer epitaxial stack is deposited on the first multi-layer epitaxial stack. Each stack includes a first sacrificial layer, a first metal, a second sacrificial layer, and a second metal. The second sacrificial layer can then be etched out and filled with a group III-V semiconductor material. The first sacrificial layer can then be removed or otherwise etched out to suspend each resonant structure above the substrate. Thus, multiple resonator structures are forwarded on a single substrate, in accordance in accordance with an example embodiment of the present disclosure.

In some embodiments, the FBAR devices may be used in RF filters or for other suitable applications, such as for duplexers, for multiplexers, for sensors, in conjunction with power amplifiers (PAs), or for low noise amplifiers (LNAs), for example. In some embodiments, the piezoelectric element of the FBAR structure may be epitaxial AlN or any other suitable epitaxial piezoelectric material, such as zinc oxide (ZnO) or lead zirconium titanate (PZT), or other III-V compounds, such as gallium nitride (GaN), indium nitride (InN), or other III-N materials, for example, as will be apparent in light of the present disclosure. As variously used herein, III-V compounds/materials include at least one group III element (e.g., aluminum, gallium, indium, boron, thallium) and at least one group V element (e.g., nitrogen, phosphorus, arsenic, antimony, bismuth). In some embodiments, group III element-nitride (III-N) compounds/materials may be particularly well-suited for the FBAR piezoelectric element, due to III-N materials having high bandgaps and other desirable properties. III-N materials, as variously used herein, include a compound of one or more group III materials (e.g., aluminum, gallium, and/or indium), with nitrogen. Accordingly, III-N materials/compounds as variously used herein include, but are not limited to, GaN, InN, AlN, AlInN, AlGaN, InGaN, and AlInGaN. In some embodiments, the use of a piezoelectric material deposited on a substrate, selectively etched and filled, results in the ability to create multiple resonator thicknesses on a common substrate, as will be further appreciated in light of this disclosure. To this end, a single substrate can be used to have vastly different resonant frequencies, depending on the various piezoelectric group III-V material thicknesses provided.

Moreover, in some embodiments, at least two resonator devices are defined, including one resonant device over the substrate and a second resonant device over the first resonant device. Further, in some embodiments, at least three resonator devices are defined, including one resonant device over the substrate, a second resonant device over the first resonant device, and a third resonant device over the second resonant device.

Use of the techniques and structures provided herein may be detectable using tools such as scanning/transmission electron microscopy (SEM/TEM), composition mapping, x-ray crystallography or diffraction (XRD), secondary ion mass spectrometry (SIMS), time-of-flight SIMS (ToF-SIMS), atom probe imaging, local electrode atom probe (LEAP) techniques, 3D tomography, high resolution physical or chemical analysis, to name a few suitable example analytical tools. In particular, such tools may indicate a structure or device configured with an FBAR structure including an epitaxial piezoelectric film as variously described herein. For example, in some embodiments, an epitaxial AlN piezoelectric film may be detected between a top and bottom electrode of an FBAR structure. In some such embodiments, the thickness and/or film quality of the FBAR piezoelectric layer may be indicative that the techniques variously described herein have been used. For example, use of the techniques variously described herein can result in an FBAR including a piezoelectric film (e.g., epitaxial AlN) having multiple thicknesses, each thickness being less than, for instance, 1 micron, or less than 500 nm, or less than 200 nm, or less than 100 nm, or less than 50 nm, or less than 25 nm, or some other suitable maximum thickness as will be apparent in light of the present disclosure. To this end, note that the thicknesses can be set based on the desired frequency ranges to be filtered. Therefore, the techniques variously described herein can be used to form higher quality FBAR structures and thus higher quality RF filters that are able to have more than one resonant frequency on a same substrate or a preformed substrate structure. Numerous benefits, configurations, and variations will be apparent in light of this disclosure.

Architecture and Methodology

FIGS. 1-8 illustrate example integrated circuit structures defining an FBAR device including a first resonator structure above a second resonator structure and having at least two different resonator thicknesses on a common substrate, in accordance with an embodiment of the present disclosure. In some embodiments, the techniques for forming FBAR structures having a piezoelectric stack include initially depositing a seed layer on a substrate, epitaxially depositing a first multi-layer stack. The multi-layer stack includes a first sacrificial layer and a second sacrificial layer, and selectively etching the first sacrificial layer and then filling it in with a piezoelectric material, and selectively etching the second sacrificial layer to suspend the piezoelectric layer above the substrate. In some such embodiments, the piezoelectric material can include various III-V materials epitaxially grown on a group IV material substrate (e.g., a silicon (Si), silicon carbide (SiC), germanium (Ge), or SiGe substrate), a sapphire substrate, or any other suitable material substrate. For example, in one specific embodiment the III-V material may include AlN. In another specific example, three multi-layer stacks are deposited on one seed layer, and a second sacrificial layer of each stack has a distinct resonant frequency from the other layers to define the resonant frequency thickness. As will be appreciated, reference herein to an epitaxial layer refers to that layer as being single crystal (sometimes called monocrystalline). Such single crystal layers are distinct from, for example, amorphous or polycrystalline layers.

Figure 1:
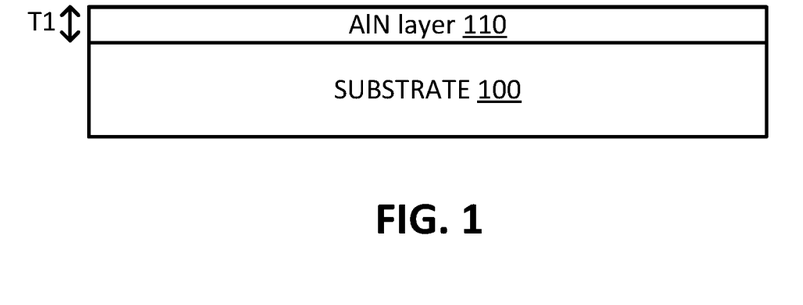
FIG. 1 illustrates an example integrated circuit structure including a substrate and having a seed layer deposited thereon, in accordance with an embodiment of the present disclosure.

FIG. 1 illustrates an example integrated circuit structure including a substrate and having a seed layer deposited thereon, in accordance with an embodiment of the present disclosure. As shown, an Aluminum Nitride (AlN) seed layer 110 is deposited on a substrate 100. The seed layer 110 can have an approximate thickness (T1) of 200 to 400 nanometers (nm). The substrate can be an appropriate group IV based substrate, such as Si (111), Si (110) or Si (100). The deposition can occur by any appropriate epitaxial technique, such as metal organic chemical vapor deposition (MOCVD), chemical vapor deposition (CVD) or molecular beam epitaxy (MBE).

Figure 2:
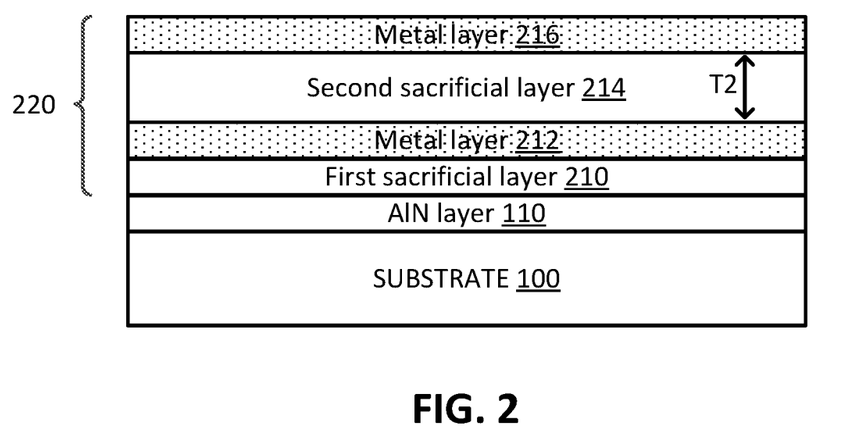
FIG. 2 illustrates an example integrated circuit structure after a first multi-layer epitaxial stack is deposited on the seed layer, in accordance with an embodiment of the present disclosure.

FIG. 2 illustrates an example integrated circuit structure after a first multi-layer epitaxial stack is deposited on the seed layer, in accordance with an embodiment of the present disclosure. A first sacrificial layer 210 is deposited on the AlN layer 110, a metal layer 212 is deposited on the first sacrificial layer 210, a second sacrificial layer 214 is deposited on the metal layer 212, and a metal layer 216 is deposited on the second sacrificial layer 214, which together make up the first multi-layer stack 220. The multi-layer stack can be deposited on the seed layer 210 according to any appropriate epitaxy technique, such as MOCVD, CVD or MBE. The multi-layer epitaxial stack 220 includes the first sacrificial layer 210, which can be polycrystalline Si or Silicon Oxide ($SiO_2$), although other group IV-based semiconductor materials can be implemented. The first sacrificial layer has a thickness of approximately 300 nm. As will be appreciated in light of this disclosure, the first sacrificial layer 210 is later removed to provide a cavity that releases the resonator structure from the substrate. The multi-layer stack 220 also includes a metal layer 212 deposited on the first sacrificial layer 210. The metal layer 212 has a thickness of approximately 100 nm-500 nm. As will be appreciated in light of the present disclosure, the metal layer 212 becomes the bottom metal contact for the first resonator structure. The multi-layer stack 220 also includes a second sacrificial layer 214, which can be Silicon Nitride (SiN) for example, or another group IV-V semiconductor material. The second sacrificial layer 214 is later removed and filled in with a piezoelectric material to define the first resonator structure, as will be appreciated in light of the present disclosure. The thickness (T2) of the second sacrificial layer 214 can be selected based on the desired resonant frequency of the particular resonator structure, as will be appreciated in light of the present disclosure. Generally, the thickness of the second sacrificial layer will be determined from the required resonator frequency. The multi-layer stack 220 also includes a metal layer 216 deposited on the second sacrificial layer 214. The metal layer 216 in an embodiment has a thickness of approximately 100 to 200 nm and can be any appropriate metal contact such as Molybdenum or Tungsten. As will be appreciated in light of the present disclosure, the metal layer 216 becomes the top metal contact for the first resonator structure.

Figure 3:
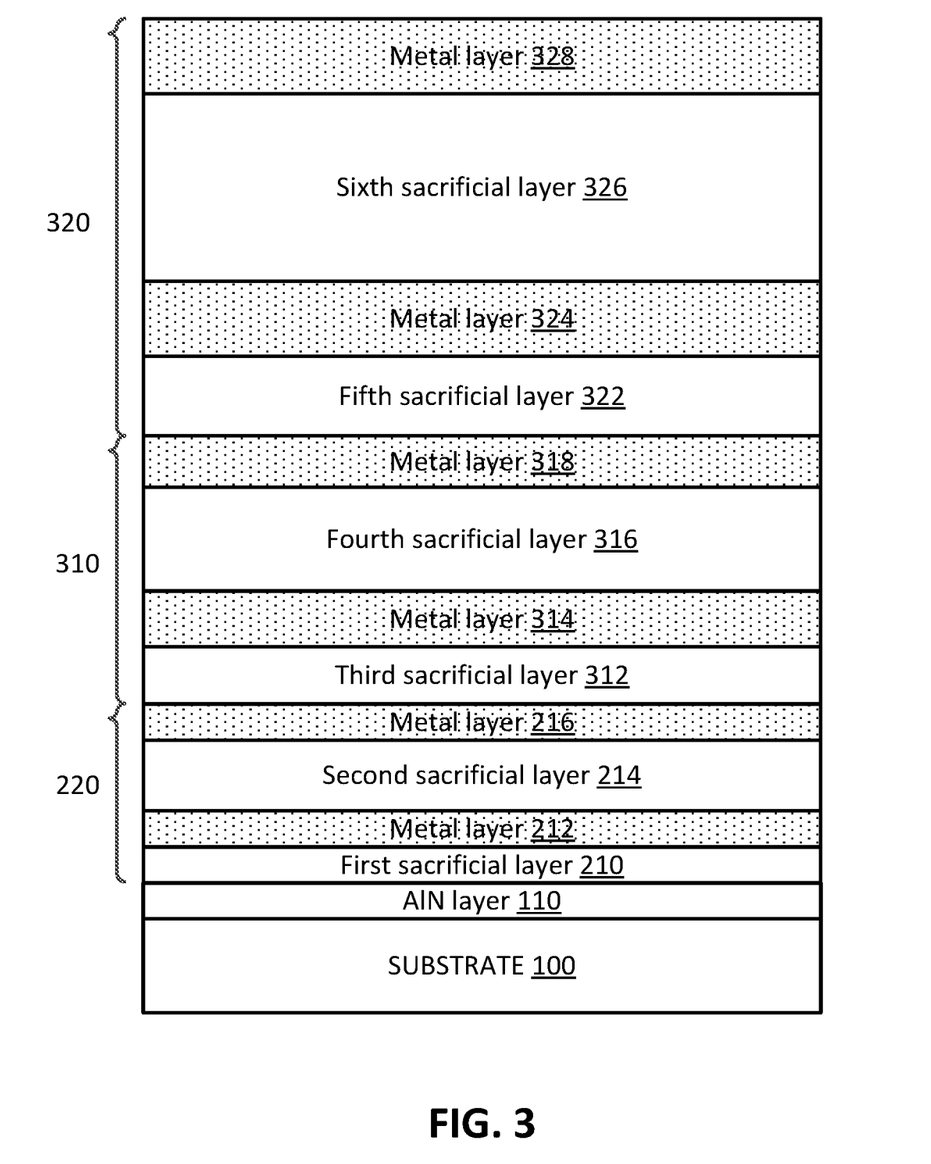
FIG. 3 illustrates an example integrated circuit structure after a second multi-layer epitaxial stack and a third multi-layer epitaxial stack are deposited on the first multi-layer epitaxial stack, in accordance with an embodiment of the present disclosure.

The multi-layer stack 220 can be repeated up to 'n' number of times, where 'n' is the number of resonators required with a different frequency. FIG. 3 illustrates an example embodiment having three different resonator devices and three different resonant frequencies provided by initially depositing three multi-layer stacks on the substrate, in accordance with an embodiment of the present disclosure.

FIG. 3 illustrates an example integrated circuit structure after a second multi-layer epitaxial stack and a third multi-layer epitaxial stack are deposited on the first multi-layer epitaxial stack, in accordance with an embodiment of the present disclosure. The multi-layer stack 210 includes a third sacrificial layer 312, a metal layer 314 deposited on the third sacrificial layer 312, a fourth sacrificial layer 316 deposited on the metal layer 314, and a metal layer 318 deposited on the fourth sacrificial layer 316. Note that the fourth sacrificial layer 316 is later removed and filled in with a piezoelectric layer to define a second resonator structure above a same substrate 110, as will be appreciated in light of the present disclosure. Also, the metal layers 318, 314 become respective top and bottom electrodes for the second resonator structure. The multi-layer stack 320 includes a fifth sacrificial layer 322, a metal layer 324 deposited on the fifth sacrificial layer 322, a sixth sacrificial layer 326 deposited on the metal layer 324, and a metal layer 328 deposited on the sixth sacrificial layer 326. Note that the sixth sacrificial layer 326 is later removed and filled in with a piezoelectric layer to define a third resonator structure above the same substrate 110, as will be appreciated in light of the present disclosure. The metal layers 328, 324 become respective top and bottom electrodes for the third resonator structure. The metal layers 314, 318, 324, 328 can be Molybdenum or Tungsten or another metal, as will be appreciated.

Figure 4:
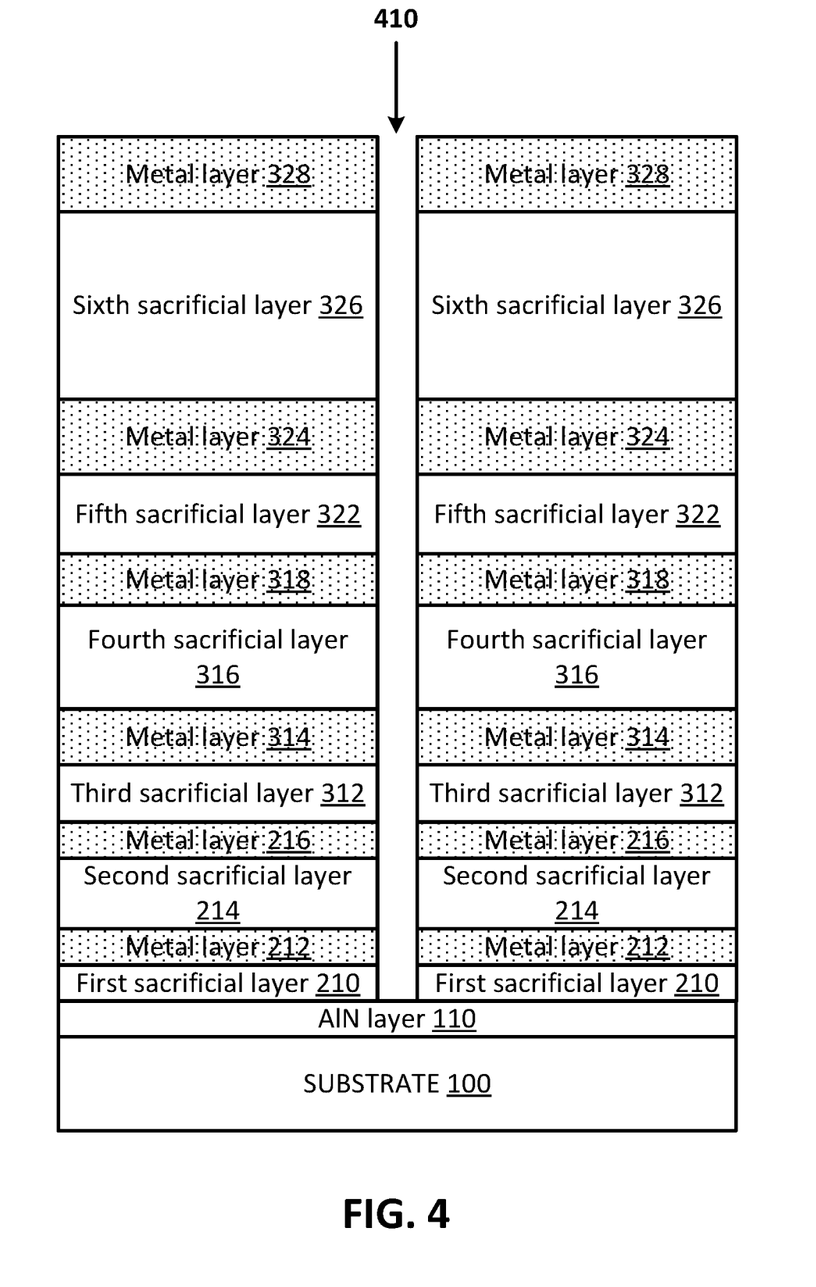
FIG. 4 illustrates an example integrated circuit structure after a deep trench has been formed in a central portion of the multi-layer stacks, in accordance with an embodiment of the present disclosure.

FIG. 4 illustrates an example integrated circuit structure after a deep trench has been formed in a central portion of the multi-layer stacks, in accordance with an embodiment of the present disclosure. A deep trench 410 is formed in a central portion of the multi-layer stacks 220, 310, 320, for example by performing dry etching. The deep trench 410 extends down to reveal the seed layer (AlN layer 110). The deep trench 410 can have a width of approximately 500 nanometers (nm) to 5 micrometers (μm). In some embodiments, a protective coating of HM, not shown in FIG. 4, can be applied to the top metal layer 328 prior to the etching of the deep trench.

Figure 5:
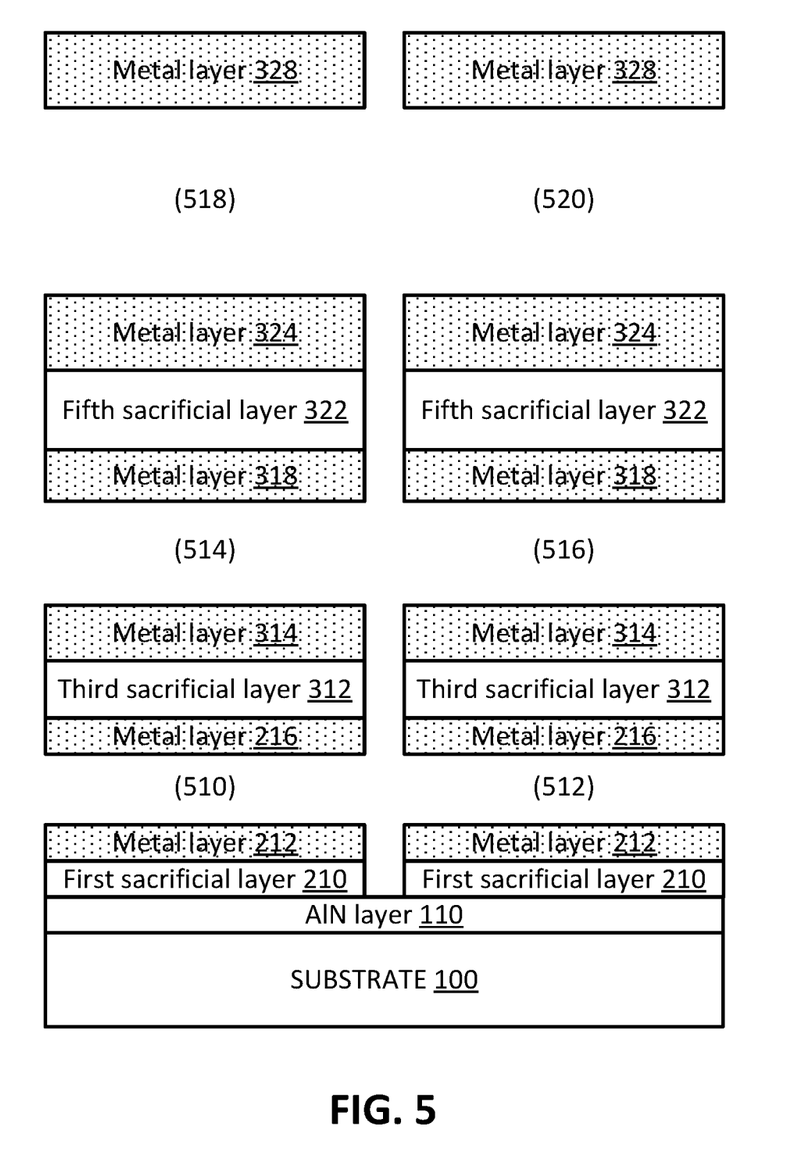
FIG. 5 illustrates an example integrated circuit structure after the second sacrificial layer of each multi-layer stack has been removed, in accordance with an embodiment of the present disclosure.

FIG. 5 illustrates an example integrated circuit structure after the second sacrificial layer of each multi-layer stack has been removed, in accordance with an embodiment of the present disclosure. As shown, the second sacrificial layer 214, the fourth sacrificial layer 316 and the sixth sacrificial layer 326 have been removed, leaving cavities 510, 512, 514, 516, 518 and 520. Note that each cavity has a predefined thickness, which is approximately equivalent to the thickness of the sacrificial layer before it was removed (for example the thickness T2 of the sacrificial layer 214). The sacrificial layers (i.e. layers 214, 316 and 326) can be selectively etched out with respect to the other layers. For example, wet etch chemistry using hot phosphoric acid can be used to selectively etch the sacrificial layer (for example, when the sacrificial layer is SiN), hot phosphoric acid etches SiN selectively over Si or $SiO_2$ and Mo or W.

Figure 6:
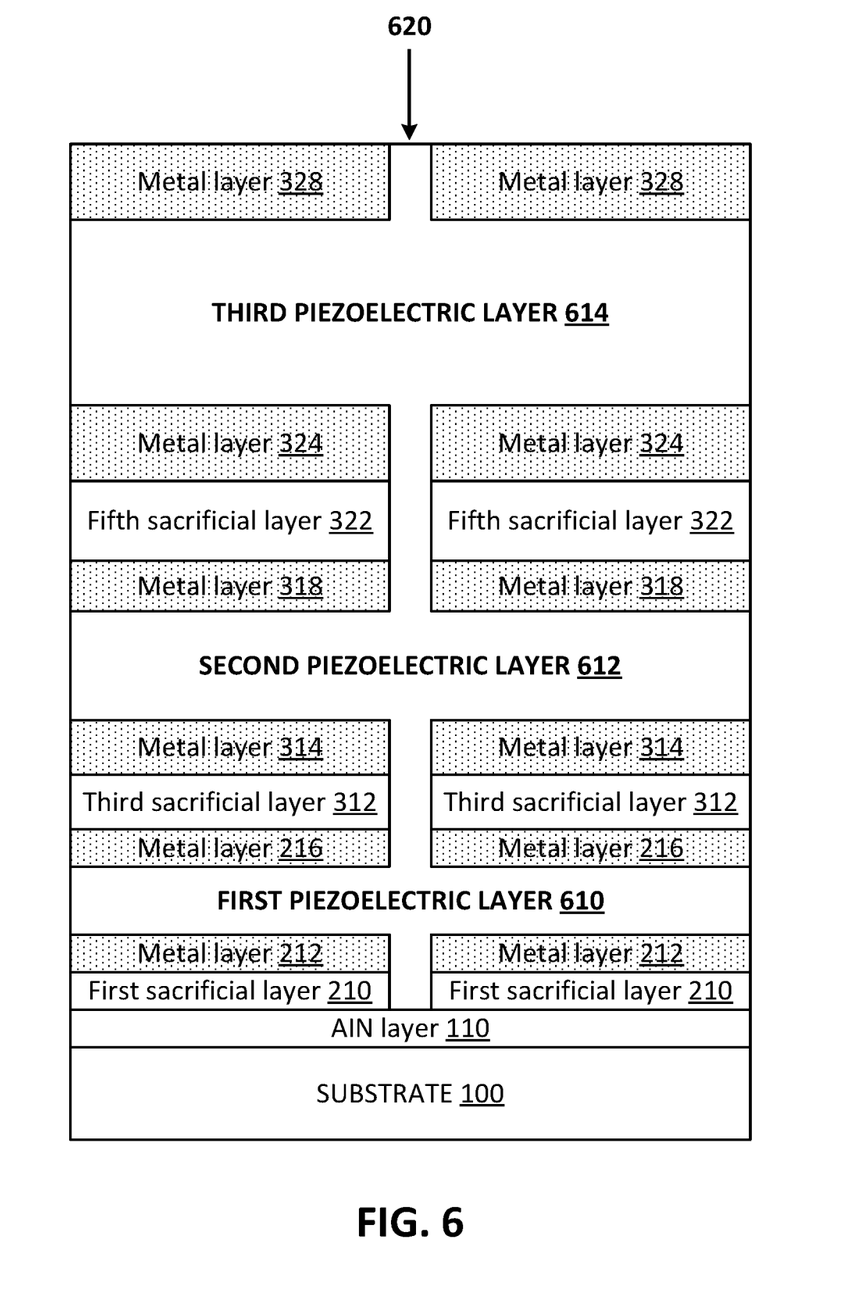
FIG. 6 illustrates an example integrated circuit structure after a group III-V semiconductor material has been deposited to fill in the cavities that remain after the second sacrificial layers have been removed, to thereby form a first piezoelectric layer, a second piezoelectric layer and a third piezoelectric layer, in accordance with an embodiment of the present disclosure.

FIG. 6 illustrates an example integrated circuit structure after a group III-V semiconductor material has been deposited to fill in the cavities that remain after the second sacrificial layers have been removed, to thereby form a first piezoelectric layer, a second piezoelectric layer and a third piezoelectric layer, in accordance with an embodiment of the present disclosure. As shown, the cavities 510, 512, 514, 516, 518 and 520 have now been filled in with a piezoelectric material to define a first piezoelectric layer 610 in the cavities 510, 512, a second piezoelectric layer 612 in the cavities 514, 516 and a third piezoelectric layer 614 in the cavities 518, 520. Also note that a backbone 620 is also formed in the trench, thereby interconnecting the first piezoelectric layer 610, the second piezoelectric layer 612 and the third piezoelectric layer 614 to the seed layer 110, in accordance with an embodiment of the present disclosure. The piezoelectric material can be Aluminum Nitride (AlN) or any other appropriate group III-V semiconductor material deposited by CVD or similar epitaxial deposition technique, as will be appreciated in light of the present disclosure. The first piezoelectric layer 610, the second piezoelectric layer 612,6 the third piezoelectric layer 614 and the backbone layer 620 can be comprised of a same group III-V semiconductor material, such as AlN. Note that since the cavities 510, 512 had a defined thickness, the first piezoelectric layer 610 also has the same defined thickness, and likewise since the cavities 514, 516 had a defined second thickness, the second piezoelectric layer also has the same defined second thickness, and also since the cavities 518, 520 had a defined third thickness, the third piezoelectric layer also had the same defined third thickness. In this manner, three (or more) different resonator structures can be provided on a same substrate that each have different thickness of piezoelectric layers, each having top and bottom metal contacts, and each thus having its own resonant frequency.

Figure 7:
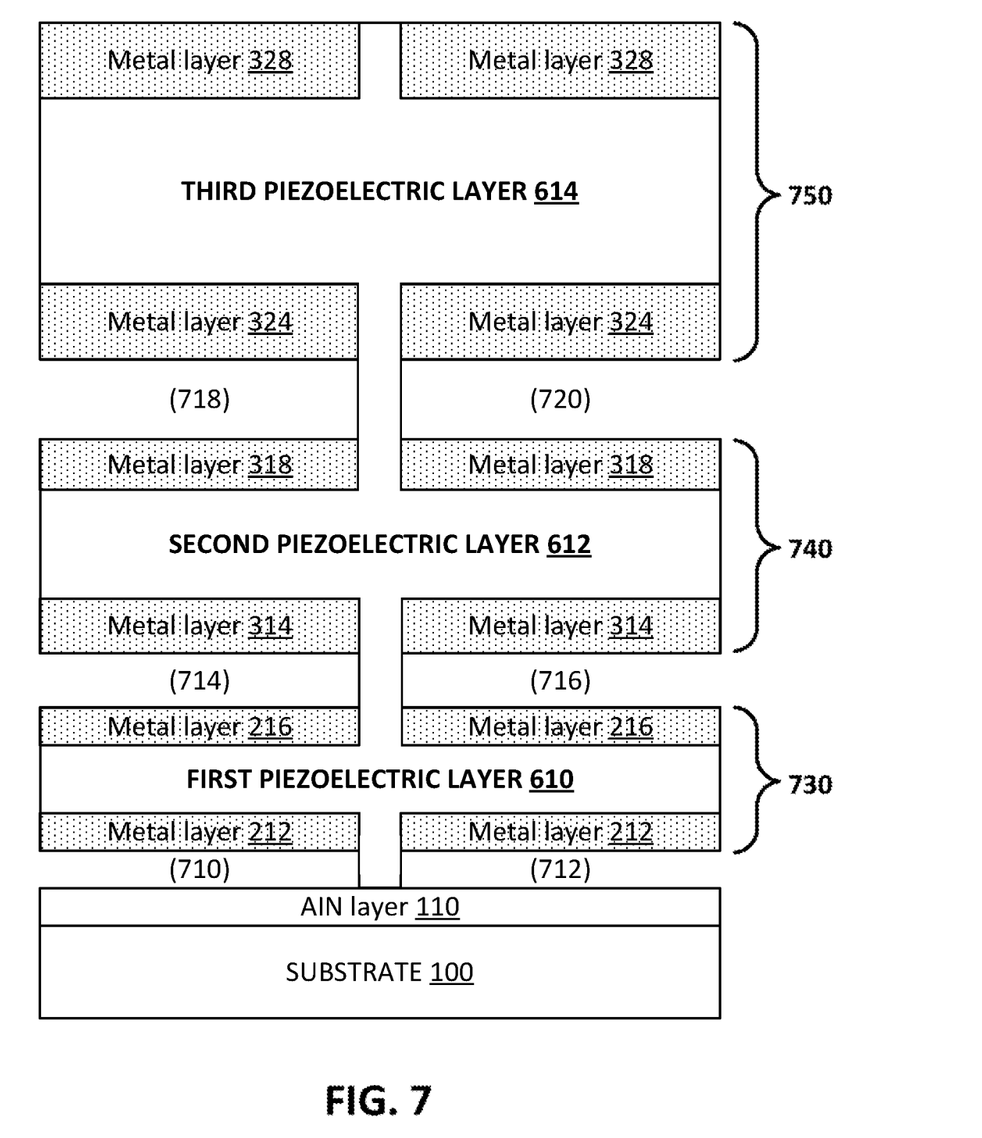
FIG. 7 illustrates an example integrated circuit structure after the first sacrificial layer of each multi-layer stack has been removed, thereby defining three separate resonators each having a different resonant frequency, in accordance with an embodiment of the present disclosure.

FIG. 7 illustrates an example integrated circuit structure after the first sacrificial layer of each multi-layer stack has been removed; thereby defining three separate resonators each having a different resonant frequency, in accordance with an embodiment of the present disclosure. As shown, the first sacrificial layer 210, second sacrificial layer 312, and fifth sacrificial layer 322 have all been removed to provide the stacked array of resonators, each having its own distinct resonant frequency. Note that there is a cavity 710, 712 where the first sacrificial layer 210 was located, which suspends the first resonator structure 730 above the substrate 100. Also note there is a cavity 714, 716 where the second sacrificial layer 312 was located, which suspends the second resonator structure 740 above the substrate 100 and above the first resonator structure 730. Further note that there is a cavity 718, 720 formed where the third sacrificial layer 322 was located, which suspends the third resonator structure 750 above the substrate 100, and above the first resonator structure 730 and the second resonator structure 740. The first resonator structure 730, with the thinnest piezoelectric layer, will generally have the highest frequency of operation, and the third resonator structure 750 with the thickest piezoelectric layer, will have the lowest frequency of operation. It will be appreciated in light of the present disclosure that any number 'N' of resonator devices can be formed on a same substrate by depositing N number of multi-layer stacks on a seed layer of a substrate to achieve N number of resonator devices, in accordance with the teachings of the present disclosure.

Figure 8:
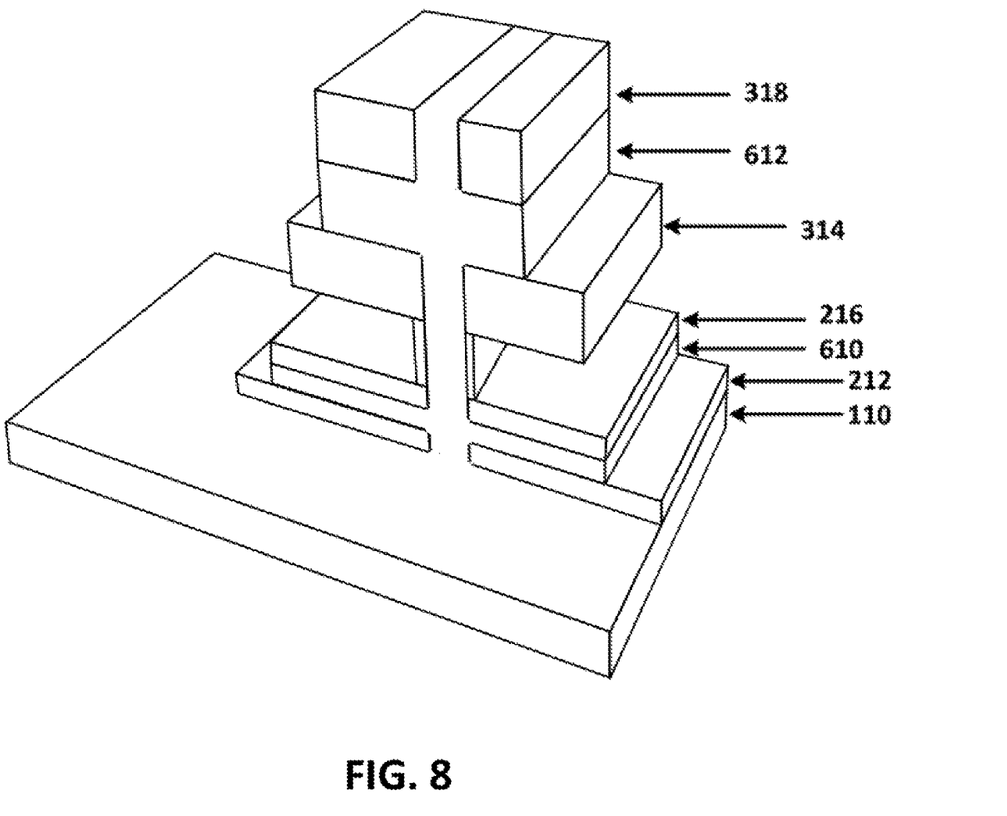
FIG. 8 illustrates a three-dimensional view of the stacked integrated circuit structure of FIG. 7, after staircase patterning has been performed on the resonator structures, in accordance with an embodiment of the present disclosure.

FIG. 8 illustrates a three-dimensional view of the stacked integrated circuit structure of FIG. 7, after staircase patterning has been performed on the resonator structures, in accordance with an embodiment of the present disclosure. As shown, a seed layer of AlN 110 has a stacked structure of resonator devices deposited therein, in accordance with an embodiment of the present disclosure. The first resonator structure includes the metal layer 212, the first piezoelectric layer 610, and the metal layer 216, as shown is stacked on seed layer 110, after staircase patterning. The second resonator structure includes the metal layer 314, the second piezoelectric layer 612 and the metal layer 318, shown stacked on the first resonator structure. In accordance with an example embodiment, the thinnest layer can stick out the most, so that the metal layers on top of each can be individually contacted in a ladder.

Figure 9:
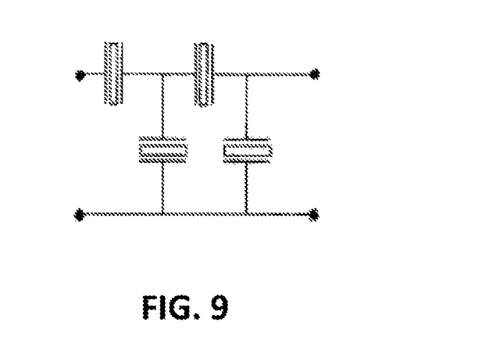
FIG. 9 illustrates a schematic diagram view of the resonant structures in a ladder filter configuration, in accordance with an embodiment of the present disclosure.

FIG. 9 illustrates a schematic diagram view of the resonant structures in a ladder filter configuration, in accordance with an embodiment of the present disclosure. The stacked structure of FIG. 8 can be interconnected in each level according to a ladder filter configuration, as will be appreciated, to achieve the desired RF filter properties. Multiple resonators of the same frequency and thickness on level 1 can be interconnected in either ladder or lattice topography to form a RF filter. Similarly, multiple resonators of the same frequency and thickness on level 2 can be interconnected in either ladder or lattice topography to form a RF filter. By this we can get stacked RF filters operating at different frequency on top of each other.

Figure 10:
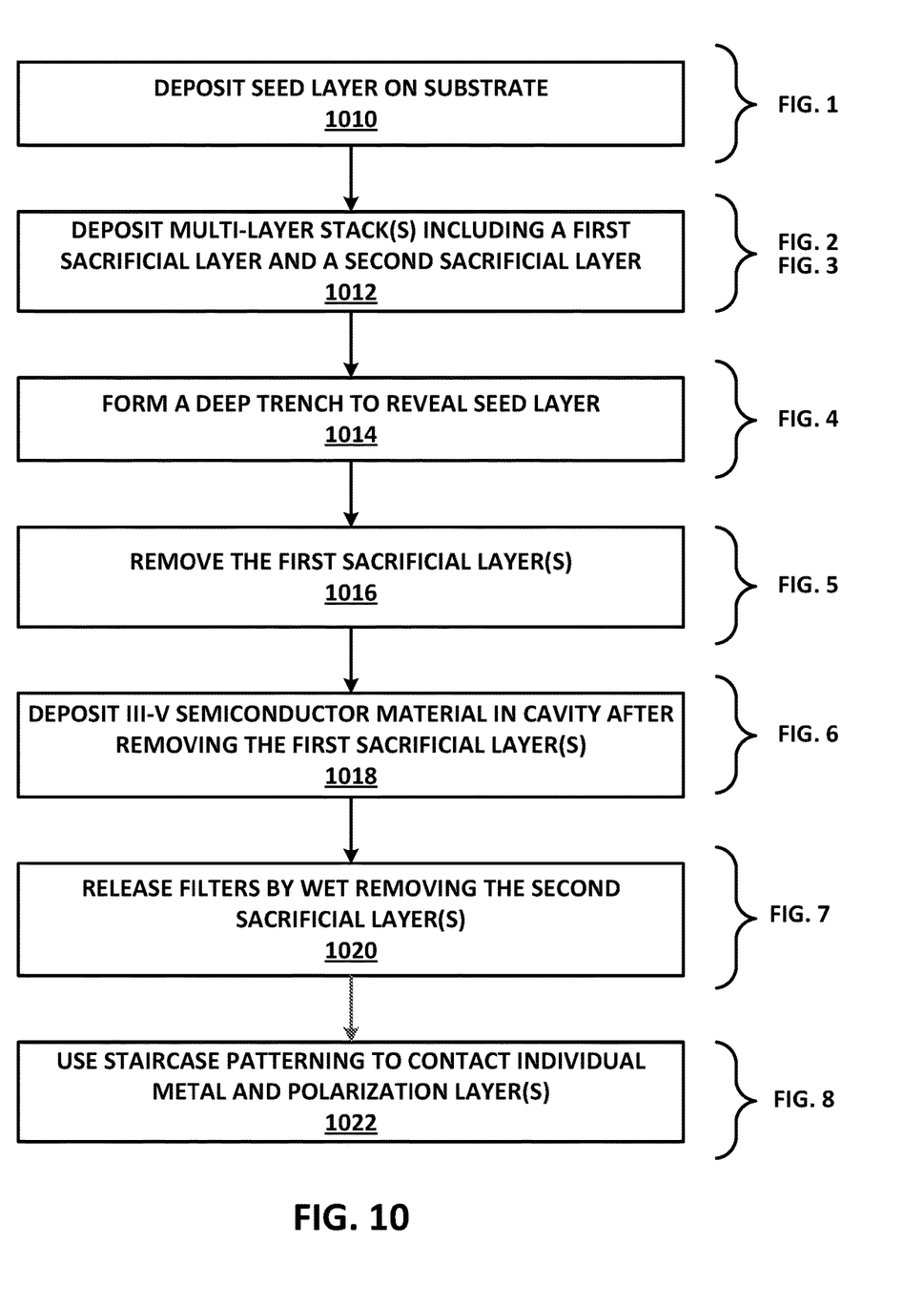
FIG. 10 illustrates a methodology for forming an integrated circuit according to FIGS. 1-8, in accordance with an example embodiment of the present disclosure.

FIG. 10 illustrates a methodology for forming an integrated circuit according to FIGS. 1-8, in accordance with an example embodiment of the present disclosure. At 1010, a seed layer is deposited on a substrate, in accordance with an embodiment of the present disclosure. The seed layer can comprise AlN and can be deposited on a Si substrate, such as Si (111), Si (110) or Si (100). Refer, for example, to FIG. 1 showing a substrate having a seed layer of AlN deposited thereon.

At 1012, one or more multi-layer stack(s) are deposited on the seed layer, in accordance with an embodiment of the present disclosure. Each multi-layer stack can include a first sacrificial layer, a first metal layer deposited on the first sacrificial layer, a second sacrificial layer deposited on the first metal layer, and a second metal layer deposited on the second sacrificial layer. Refer, for example, to FIG. 2 showing a single multi-layer stack (220) deposited on a substrate and seed layer, and FIG. 3 showing three multi-layer stacks (220, 310, 320) deposited on a substrate and seed layer. Note that each multi-layer stack includes a second sacrificial layer having a thickness that can be greater than the stack under it. In this manner, the lowest sacrificial layer (e.g., second sacrificial layer 214 in FIGS. 2 and 3) has the smallest thickness, and the topmost sacrificial layer has the greatest thickness (e.g., sixth sacrificial layer 326 in FIG. 3), such that differing thickness resonator structures can be provided on a same substrate.

At 1014, a deep trench is formed in the multi-layer stack(s) to reveal the seed layer, in accordance with an embodiment of the present disclosure. The deep trench can be formed by a combination of dry etching to remove a central portion of each multi-layer stack. Refer, for example, to FIG. 4 showing an example integrated circuit structure after a deep trench is formed in the multi-layer stacks, in accordance with an embodiment of the present disclosure. After the deep trench is formed, at 1016, the first sacrificial layer(s) are removed, in accordance with an embodiment of the present disclosure. The first sacrificial layer(s) can be removed according to a selective wet etching technique, such as using hot phosphoric acid, which can selectively etch the sacrificial layer with respect to the other layers, for example, selectively etching SiN with respect to Si, $SiO_2$, Mo or W. In this manner, only the first sacrificial layer(s) are removed from the multi-layer stack. Refer, for example, for FIG. 5 showing an example integrated circuit structure after the first sacrificial layer(s) have been removed.

At 1018, a piezoelectric group III-V semiconductor material is deposited in the cavity formed by removing the first sacrificial layer(s). Refer, for example, to FIG. 6 showing a first piezoelectric layer 610, a second piezoelectric layer 612 and a third piezoelectric layer 614 formed in the cavities of the second sacrificial layers. Also note that a backbone layer 620 is formed in the trench and interconnects the first piezoelectric layer 610, the second piezoelectric layer 612 and the third piezoelectric layer 614 to the underlying seed layer 110. The group III-V semiconductor material can be AlN, for example.

At 1020, the second sacrificial layers are removed, thereby releasing the individual filters, in accordance with an example embodiment. The second sacrificial layers can be removed according to any appropriate technique, such as wet etching using hydrofluoric acid or NH4OH with hydrofluoric acid. Removing the second sacrificial layers provides a structure having three distinct resonator structures, each suspended above a common substrate. Refer, for example, to FIG. 7 showing an example integrated circuit structure with a first resonator device released above a substrate, a second resonator device released above the substrate and above the first resonator device, and a third resonator device released above the substrate and above the first resonator device and also above the second resonator device.

Once the individual resonator structures have been formed, at 1022 a patterning, such as staircase patterning, can be performed to access each of the levels of the resonators, in accordance with an embodiment of the present disclosure. Refer, for example, to FIG. 8 illustrating a three-dimensional example integrated circuit structure after staircase patterning has been performed, in accordance with an example embodiment. Each resonator device is patterned, for example in a staircase configuration, such that the bottom most (thinnest) piezoelectric layer protrudes the farthest, and the topmost (thickest) piezoelectric layer protrudes the least. The individual metal and polarization layers can be accessed and contacted in an appropriate filter configuration, such as a ladder filter shown in FIG. 9. Accordingly, an FBAR with multiple frequencies on the same substrate can be provided.

Example System

Figure 11:
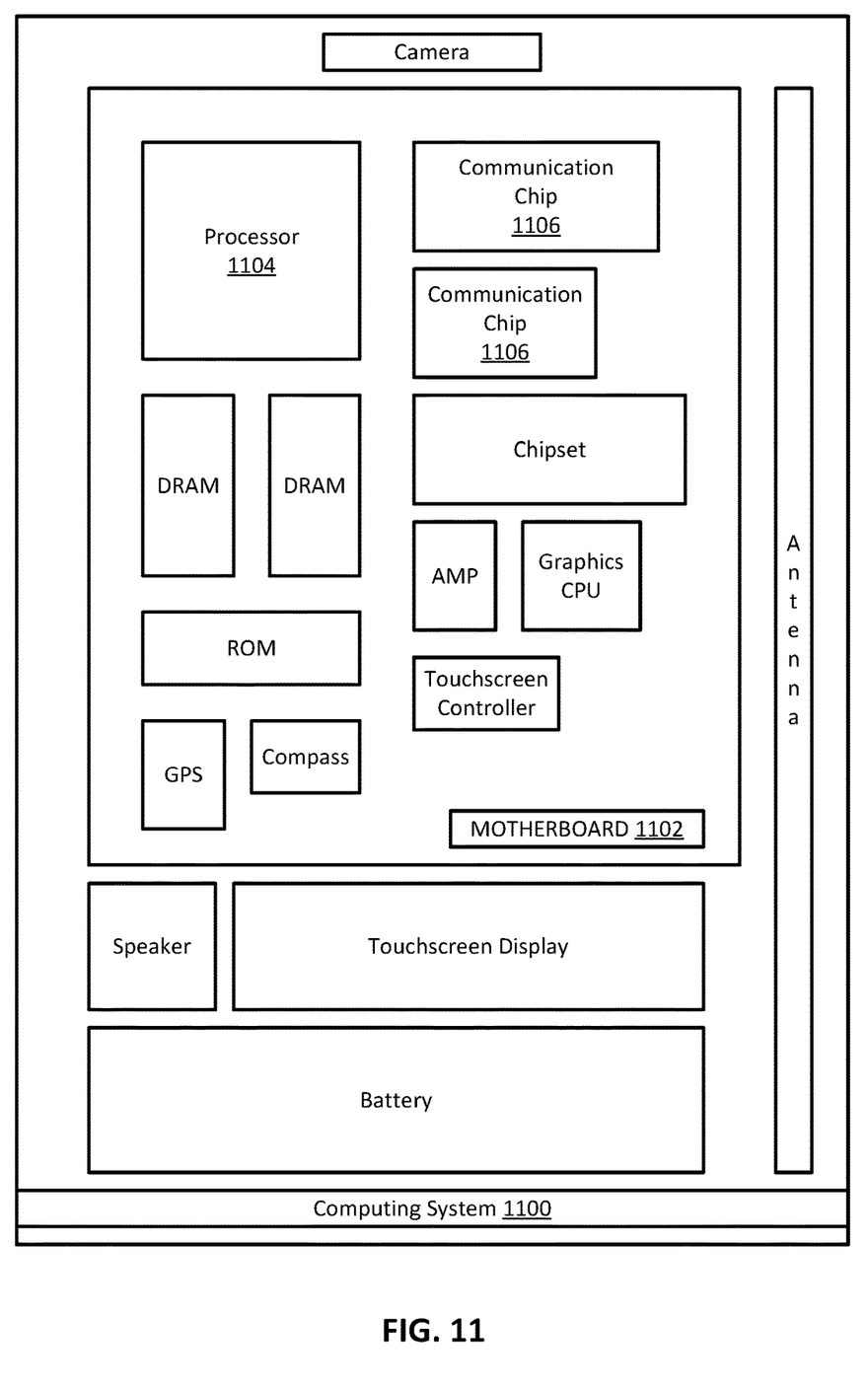
FIG. 11 illustrates a computing system implemented with integrated circuit structures or devices formed using the techniques disclosed herein, in accordance with an embodiment of the present disclosure.

FIG. 11 illustrates a computing system 1100 implemented with integrated circuit structures or devices formed using the techniques disclosed herein, in accordance with an example embodiment. As can be seen, the computing system 1100 houses a motherboard 1102. The motherboard 1102 may include a number of components, including, but not limited to, a processor 1104 and at least one communication chip 1106, each of which can be physically and electrically coupled to the motherboard 1102, or otherwise integrated therein. As will be appreciated, the motherboard 1102 may be, for example, any printed circuit board, whether a main board, a daughterboard mounted on a main board, or the only board of system 1100, etc.

Depending on its applications, computing system 1100 may include one or more other components that may or may not be physically and electrically coupled to the motherboard 1102. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1100 may include one or more integrated circuit structures or devices formed using the disclosed techniques in accordance with an example embodiment. In some embodiments, multiple functions can be integrated into one or more chips (e.g., for instance, note that the communication chip 1106 can be part of or otherwise integrated into the processor 1104).

The communication chip 1106 enables wireless communications for the transfer of data to and from the computing system 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1100 may include a plurality of communication chips 1106. For instance, a first communication chip 1106 may be dedicated to shorter range wireless communications such as Wi-Fi and Bluetooth and a second communication chip 1106 may be dedicated to longer range wireless communications such as GPS, EDGE, GPRS, CDMA, WiMAX, LTE, Ev-DO, and others. In some embodiments, communication chip 1106 may include one or more FBAR structures as variously described herein (e.g., FBAR including a relatively thin epitaxial AlN piezoelectric element), and such FBAR structures may be included in one or more RF filters. Further, such RF filters may be configured to be high frequency filters (e.g., operating at greater than 1, 2, 3, 4, or 5 GHz). Further still, such RF filters may be included in the RF front end of computing system 1100 and they may be used for 5G wireless standards or protocols, for example.

The processor 1104 of the computing system 1100 includes an integrated circuit die packaged within the processor 1104. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1106 also may include an integrated circuit die packaged within the communication chip 1106. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1104 (e.g., where functionality of any chips 1106 is integrated into processor 1104, rather than having separate communication chips). Further note that processor 1104 may be a chip set having such wireless capability. In short, any number of processor 1104 and/or communication chips 1106 can be used. Likewise, any one chip or chip set can have multiple functions integrated therein.

In various implementations, the computing system 1100 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is an integrated circuit resonator device comprising: a substrate; a first resonator structure over the substrate, the first resonator structure including a first piezoelectric layer on a first bottom metal contact, the first piezoelectric layer having a first thickness, and a first top metal contact on the first piezoelectric layer; and a second resonator structure over the first resonator structure, the first resonator structure including a second piezoelectric layer on a second bottom metal contact, the second piezoelectric layer having a second thickness that is distinct from the first thickness of the first piezoelectric layer, and a second top metal contact on the second piezoelectric layer; wherein the first piezoelectric layer and the second piezoelectric layer are comprised of a group III-V single crystal semiconductor material.

Example 2 includes the subject matter of Example 1, wherein the first piezoelectric layer and the second piezoelectric layer are comprised of a same group III-V single crystal semiconductor material that includes at least one of: Aluminum Nitride (AlN) and Aluminum Scandium Nitride (AlScN).

Example 3 includes the subject matter of any of Examples 1-2, further comprising a backbone layer of a group III-V semiconductor material that interconnects the substrate to the first resonator structure and the second resonator structure.

Example 4 includes the subject matter of Example 3, wherein the first piezoelectric layer, the second piezoelectric layer, and the backbone layer are comprised of a same group III-V single crystal semiconductor material.

Example 5 includes the subject matter of any of Examples 1-4, further comprising a third resonator structure over the second resonator structure, the third resonator structure including a third piezoelectric layer on a third bottom metal contact, and a third top metal contact on the third piezoelectric layer.

Example 6 includes the subject matter of Example 5, wherein the third piezoelectric layer has a third thickness that is distinct from the first thickness and the second thickness.

Example 7 includes the subject matter of any of Examples 1-6, wherein the first bottom metal contact and the second bottom metal contact are comprised of a same metal.

Example 8 includes the subject matter of any of Examples 1-7, wherein the first bottom metal contact and the second bottom metal contact are comprised of at least one of Tungsten (W) and Molybdenum (Mo).

Example 9 includes the subject matter of any of Examples 1-8, wherein the substrate comprises at least one of: Silicon (111), Silicon (110) and Silicon (100).

Example 10 includes the subject matter of any of Examples 1-9, further comprising a seed layer over the substrate having a same group III-V semiconductor material as the first piezoelectric layer and the second piezoelectric layer.

Example 11 includes the subject matter of any of Examples 1-10, wherein the first resonator structure has a first resonant frequency and the second resonator structure has a second resonant frequency that is distinct from the first resonant frequency.

Example 12 includes a radio frequency (RF) communications integrated circuit device including the integrated circuit resonator device of any of Examples 1-11.

Example 13 includes an integrated circuit resonator device comprising: a substrate; a first resonator structure over the substrate and comprising a first epitaxial group III-V semiconductor material layer suspended above the substrate and having first top and bottom metal contacts, the first resonant structure having a first resonant frequency; a second resonator structure over the first resonator structure and comprising a second epitaxial group III-V semiconductor material layer and having second top and bottom metal contacts, the second resonant structure having a second resonant frequency; and a backbone layer of epitaxial III-V semiconductor material that interconnects the first resonator structure and the second resonator structure.

Example 14 includes the subject matter of Example 13, wherein the first epitaxial group III-V semiconductor material layer and the second epitaxial group III-V semiconductor material layer are comprised of a group III-V single crystal semiconductor material.

Example 15 includes the subject matter of any of Examples 13-14, wherein the first epitaxial group III-V semiconductor material layer and the second epitaxial group III-V semiconductor material layer are comprised of a same group III-V single crystal semiconductor material that includes at least one of: aluminum, nitrogen, and scandium.

Example 16 includes the subject matter of any of Examples 13-15, wherein the backbone layer interconnects the first and second resonators to a third resonator structure above the second resonator structure.

Example 17 includes the subject matter of any of Examples 13-16, wherein the first epitaxial group III-V semiconductor material layer, the second epitaxial group III-V semiconductor material layer, and the backbone layer are comprised of a same group III-V single crystal semiconductor material.

Example 18 includes the subject matter of any of Examples 13-17, further comprising a third resonator structure over the second resonator structure, the third resonator structure including a third epitaxial group III-V semiconductor material layer on a third bottom metal contact, and a third top metal contact on the third epitaxial group III-V semiconductor material layer.

Example 19 includes the subject matter of Example 18, wherein the third epitaxial group III-V semiconductor material layer has a third thickness that is distinct from a first thickness of the first epitaxial group III-V semiconductor material layer and a second thickness of the second epitaxial group III-V semiconductor material layer.

Example 20 includes the subject matter of any of Examples 13-19, wherein the first top and bottom metal contacts and the second top and bottom metal contacts are comprised of a same metal.

Example 21 includes the subject matter of Example 20, wherein the first top and bottom metal contacts and the second top and bottom metal contacts are comprised of at least one of Tungsten (W) and Molybdenum (Mo).

Example 22 includes the subject matter of any of Examples 13-21, wherein the substrate comprises at least one of: Silicon (111), Silicon (110) and Silicon (100).

Example 23 includes the subject matter of any of Examples 13-22, further comprising a seed layer over the substrate having a same group III-V semiconductor material as the first epitaxial group III-V semiconductor material layer and the second epitaxial group III-V semiconductor material layer.

Example 24 includes the subject matter of any of Examples 13-23, wherein the second resonant frequency is distinct from the first resonant frequency.

Example 25 includes a radio frequency (RF) communications integrated circuit device comprising the device of any of Examples 13-24.

Example 26 is a method of forming a resonator device, the method comprising: depositing a seed layer of a first group III-V semiconductor material on a substrate; depositing one or more multi-layer stacks on or over the seed layer, each multi-layer stack including a first sacrificial layer, a first metal layer over the first sacrificial layer, a second sacrificial layer over the first metal layer, and a second metal layer over the second sacrificial layer; forming a trench in a central portion of the one or more multi-layer stacks to reveal the seed layer; removing the second sacrificial layer of the one or more multi-layer stacks to form one or more cavities; depositing a piezoelectric layer of a second group III-V semiconductor material to fill in the one or more cavities; and removing the first sacrificial layer of the one or more multi-layer stacks.

Example 27 includes the subject matter of Example 26, further comprising patterning the one or more multi-layer stacks to contact individual metal and polarization layers of each multi-layer stack.

Example 28 includes the subject matter of any of Examples 26-27, wherein forming the trench comprises dry etching through the central portion of the one or more multi-layer stacks.

Example 29 includes the subject matter of any of Examples 26-28, wherein the removing the second sacrificial layer comprises selectively wet etching the second sacrificial layer.

Example 30 includes the subject matter of Example 29, wherein hot phosphoric acid is used to selectively wet etch the second sacrificial layer.

Example 31 includes the subject matter of any of Examples 26-30, wherein the removing the first sacrificial layer comprises selectively wet etching the first sacrificial layer.

Example 32 includes the subject matter of any of Examples 26-31, wherein the depositing the piezoelectric layer comprises implementing a chemical vapor deposition (CVD) technique.

Example 33 includes the subject matter of any of Examples 26-32, wherein the first sacrificial layer comprises Si or SiO2, and wherein the second sacrificial layer comprises Silicon Nitride (SiN).

Example 34 includes the subject matter of any of Examples 26-33, wherein the depositing the first metal layer and the second metal layer are performed using atomic layer deposition (ALD).

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit comprising: a first resonator structure, the first resonator structure including a first layer on a first bottom contact, the first layer having a first thickness, and a first top contact on the first layer; and
a second resonator structure over the first resonator structure, the second resonator structure including a second layer on a second bottom contact, the second layer having a second thickness that is distinct from the first thickness of the first layer, and a second top contact on the second layer, wherein the second bottom contact of the second resonator structure is vertically separated from the first top contact of the first resonator structure, defining a cavity between the second bottom contact of the second resonator structure and the first top contact of the first resonator structure; and
wherein the first layer and the second layer comprise a group III-V single crystal piezoelectric semiconductor material, and the first and second bottom contacts and the first and second top contacts comprise a metal.

2. The integrated circuit of claim 1, further comprising a backbone layer of a group III-V semiconductor material that interconnects an underlying substrate to the first resonator structure and the second resonator structure.

3. The integrated circuit of claim 1, further comprising a third resonator structure over the second resonator structure, the third resonator structure including a third layer on a third bottom contact, and a third top contact on the third layer, wherein the third layer comprises a group III-V single crystal piezoelectric semiconductor material, and the third bottom contact and the third top contact each comprise a metal.

4. The integrated circuit of claim 3, wherein the third layer has a third thickness that is distinct from the first thickness and the second thickness.

5. The integrated circuit of claim 1, wherein the first bottom contact and the second bottom contact are comprised of a same metal.

6. The integrated circuit of claim 1, further comprising an underlying substrate such that the first resonator structure if over the substrate, wherein the substrate comprises at least one of: Silicon (111), Silicon (110), and Silicon (100).

7. The integrated circuit of claim 1, further comprising a seed layer over an underlying substrate, the seed layer being between the substrate and the first resonator structure and having a same group III-V semiconductor material as the first layer and the second layer.

8. The integrated circuit of claim 1, wherein the first resonator structure has a first resonant frequency and the second resonator structure has a second resonant frequency that is distinct from the first resonant frequency.

9. A radio frequency (RF) communications device comprising the integrated circuit of claim 1.

10. An integrated circuit comprising:
a substrate;
a first resonator structure over the substrate and comprising a first epitaxial group III-V semiconductor material layer above the substrate and having first top and bottom metal contacts, the first resonant structure having a first resonant frequency;
a second resonator structure over the first resonator structure and comprising a second epitaxial group III-V semiconductor material layer and having second top and bottom metal contacts, the second resonant structure having a second resonant frequency, wherein the second bottom contact of the second resonator structure is vertically separated from the first top contact of the first resonator structure, defining a cavity between the second bottom contact of the second resonator structure and the first top contact of the first resonator structure; and a backbone layer of epitaxial III-V semiconductor material that interconnects the first resonator structure and the second resonator structure.

11. The integrated circuit of claim 10, wherein the first epitaxial group III-V semiconductor material layer and the second epitaxial group III-V semiconductor material layer are comprised of a group III-V single crystal semiconductor material.

12. The integrated circuit of claim 10, wherein the first epitaxial group III-V semiconductor material layer and the second epitaxial group III-V semiconductor material layer are comprised of a same group III-V single crystal semiconductor material that includes at least one of: aluminum, nitrogen, and scandium.

13. The integrated circuit of claim 10, further comprising a third resonator structure over the second resonator structure, the third resonator structure including a third epitaxial group III-V semiconductor material layer on a third bottom metal contact, and a third top metal contact on the third epitaxial group III-V semiconductor material layer.

14. The integrated circuit of claim 13, wherein the third epitaxial group III-V semiconductor material layer has a third thickness that is distinct from a first thickness of the first epitaxial group III-V semiconductor material layer and a second thickness of the second epitaxial group III-V semiconductor material layer.

15. The integrated circuit of claim 10, wherein the first top and bottom metal contacts and the second top and bottom metal contacts are comprised of a same metal.

16. The integrated circuit of claim 10, wherein the second resonant frequency is distinct from the first resonant frequency.

* * * * *